United States Patent

Speier et al.

[11] Patent Number: 6,133,063
[45] Date of Patent: Oct. 17, 2000

[54] PROCESS FOR PRODUCING A PIN LAYER SEQUENCE ON A PEROVSKITE AND A PEROVSKITE HAVING A PIN LAYER SEQUENCE

[75] Inventors: Wolfgang Speier, Jülich, Germany; Krzysztof Szot, Katowice, Poland

[73] Assignee: Forschungszentrum Jülich GmbH, Jülich, Germany

[21] Appl. No.: 09/177,225

[22] Filed: Oct. 22, 1998

Related U.S. Application Data

[63] Continuation-in-part of application No. PCT/DE97/00822, Apr. 23, 1997.

[30] Foreign Application Priority Data

Apr. 26, 1996 [DE] Germany ............... 196 16 730
Jul. 1, 1996 [DE] Germany ............... 196 26 343

[51] Int. Cl.$^7$ .................................................. H01L 21/00
[52] U.S. Cl. ................... 438/95; 257/290; 257/295; 438/104; 438/146; 423/593
[58] Field of Search ............... 438/95, 104, 142, 438/146, 197, 466; 257/43, 76, 288, 290, 295, 458, 613; 423/579, 592, 593; 361/321.1–321.5, 311–314; 365/145, 149

[56] References Cited

U.S. PATENT DOCUMENTS 5,270,298  12/1993  Ramesh .
5,491,102   2/1996  Desu et al. .
5,838,034  11/1998  Fang et al. .............................. 257/295

*Primary Examiner*—Charles Bowers
*Assistant Examiner*—Keith Christianson
*Attorney, Agent, or Firm*—Klaus J. Bach

[57] ABSTRACT

In a process for producing a pin layer sequence on a perovskite of the type $ABO_3$ which has AO layers, AO layers are converted such that a p-conductive B-oxide rich layer and, disposed therebetween an $ABO_3$ layer with intrinsic conductivity are formed. Also, a perovskite of the type $ABO_3$ with a layer sequence on the surface which includes an AO-enriched $(ABO_3)$-layer, a B-oxide rich layer and disposed therebetween an $ABO_3$ layer and an electronic building element comprising such a perovskite.

11 Claims, 1 Drawing Sheet

PROCESS FOR PRODUCING A PIN LAYER SEQUENCE ON A PEROVSKITE AND A PEROVSKITE HAVING A PIN LAYER SEQUENCE

This is a continuation-in-part application of pending international application PCT/DE97/00822 filed Apr. 23, 1997 and claiming the priority of German application 196 16 730.2 filed Apr. 26, 1996 and 196 26 343.3 filed Jul. 01, 1996.

BACKGROUND OF THE INVENTION

The invention resides in a process for producing a pin layer sequence which has an AO enriched $AO(ABO_3)$ layer, a B layer rich in oxides and an $ABO_3$ layer disposed therebetween. It also resides in a layer sequence made in accordance with the process of the invention. A and B herein are the elements of a perovskite of the type $ABO_3$ (for example, $SrTiO_3$, $BaTiO_3$, $PbTiO_3$, or $KNbO_3$).

The invention further resides in device with such layer sequences.

Perovskites of the type $ABO_3$ are utilized as substrates for a single crystal layer growth. It is known that, during production of the layers, the layers are deposited on the substrate that is on the perovskite. The layer sequences formed in this way are needed for example for the manufacture of electronic building components.

In this connection layer sequences with pin transitions are of interest. P indicates the p-conductive layer, n stands for an n-conductive layer and i indicates a layer with intrinsic properties, that is, this layer has intrinsic conductivity. At one side of the i layer with intrinsic conductivity, the p-conductive layer is disposed and at the other side there is the n-conductive layer.

It is the object of the present invention to provide a simple process for the manufacture of a pin layer arrangement and to provide a layer arrangement formed in accordance with the method of the invention.

SUMMARY OF THE INVENTION

In a process for producing a pin layer sequence on a perovskite of the type $ABO_3$ which has AO layers, AO layers are redistributed such that a p-conductive AO-rich layer, a B-oxide rich layer and, disposed therebetween an $ABO_3$ layer with intrinsic conductivity are formed. Also, a perovskite of the type $ABO_3$ with a layer sequence on the surface which includes an AO-enriched $(ABO_3)$-layer, a B-oxide rich layer and disposed therebetween an $ABO_3$ layer and an electronic building element comprising such a perovskite.

The method of the invention will be described below in greater detail on the basis of examples.

DESCRIPTION OF PREFERRED EMBODIMENTS

A pin layer sequence is made in accordance with the method of the invention by suitably relocating the AO layer in a perovskite of the type $ABO_3$. In the regions from which the AO-layers were transferred, (that is, from where they were removed) B-oxide rich layers are formed according to $BO_2$, $B_nO_{2n-1}$ or $BO_2x(ABO_3)_n$. In the regions to which AO layers were transferred layers with an $AOx(ABO_3)_m$ structure are formed. A layer with an $ABO_3$ structure remains in between.

The $ABO_3$ layer is the layer with intrinsic conductivity. The $ABO_3$ layer is a semi-conductor with a wide band gap or an insulator with a small band gap.

The B-oxide rich layer is the layer with n-conductive properties. The $AOx(ABO_3)_m$-layer has p-conductive properties.

With further reduction, the B-oxide rich layer assumes semi-metallic properties.

A transfer of AO layers as claimed is achieved especially by exposing the perovskite to oxidizing or reducing conditions. The conditions favorable for such a process as defined in the dependent process claims will be discussed further below.

Under defect chemical diagram, the defect concentration as a function of the oxygen partial pressure ($pO_2$) is to be understood. A diagram is established herefor, wherein the electric conductivity of the perovskite over the oxygen partial pressure isotherm (temperature T=constant) is plotted.

Crystals or thin crystalline layers of perovskites of the $ABO_3$-type are treated at temperatures above 500° C. under controlled atmospheric $O_2$-conditions for a certain period (treatment period). Under such conditions, a surface region is formed on the surface of the initial material which consists of layers (multi-layer) of different chemical compositions in a direction normal to the surface (along the surface normal). At a high oxygen partial pressure (oxidizing conditions: $pO_2$, dependent on temperature, must be above the minimum of the respective isotherm in the defect chemical diagram), the following layer sequence is formed—starting at the surface:

The uppermost layer has a structure of the general form $AOx(ABO_3)m$. At the surface, the m is the smallest. There is a direct contact with the atmospheric $O_2$ (m=1 can be achieved with a suitable $pO_2$ and appropriate treatment period). With increasing layer depth of the crystalline material, m increases until the layer corresponds to the intrinsic $ABO_3$ type. At still greater layer depth, certain structures are formed by enrichment of oxides with the elements B (for example, $BO_2$, $B_nO_{2n-1}$, $BO_2xABO_3)_n$). The thickness of the multi-layer system depends on the treatment time and temperature. The interface between the areas changes with temperature and time toward greater depth of the surface region. (Example: after 1 hour treatment time at temperatures of 850–900° C., and an oxygen partial pressure of $10^2$ Torr on a $SrTiO_3$ perovskite, a 100 nm surface region or multi-layer area with pin transitions is formed). The thickness of the intrinsic layer was typically less than 20% of the thickness of the $SrOx(SrTiO_3)m$ layer.

The various layers are different as to their electrical and dielectric properties. The upper $AOx(ABO_3)m$ layer acts like a p conductor, the lowermost layer with B-oxides exhibits properties of an n-conductor. The two layers are separated by a thin layer with the intrinsic properties (i) of the original material. Consequently, a layer sequence with a pin structure is formed (pin-transitions) as viewed from the surface. The thickness of the layer with the intrinsic properties is generally below 20% of the p-conductive surface layer.

With low oxygen partial pressure, that is, under reducing conditions (the oxygen partial pressure $pO_2$ (T) which depends on the temperature (T) must be below the minimum of the respective isotherm in the defect chemical diagram) the opposite sequence of the layers is formed as starting at the surface:

The uppermost layer comprises a B-rich oxide. The intermediate layer corresponds to the original $ABO_3$ material. The lowermost layer again has the general structure $AOx(ABO_3)m$. The thickness of the $ABO_3$ layer is less than 20% of the upper layer which is enriched with oxygen.

As viewed from the surface, this layer system exhibits a nip structure.

Under reducing $pO_2$ conditions and temperatures above 500° C., the upper layer is, starting at the surface, more and more reduced with increasing treatment duration, that is, oxygen is released to the atmosphere and oxygen depleted B-oxides are consequently formed. The uppermost layer exhibits semi-metallic properties (s) at the surface. In this way, a snip structure can be formed. After cool-down, the semi-metallic layer is again partially charged with oxygen.

For the manufacture of locally limited areas with pin transitions at the surface of the perovskite, the local area is heated to a greater degree than the surrounding area. This local heating is performed, for example, by a laser beam. If the perovskite is now exposed to reducing or oxidizing conditions, the transfer occurs (first) only in the locally heated area. In this way, pin structures can be formed at the surface of a perovskite.

For example, the perovskite is heated to a temperature of 500° C. The perovskite is subjected to a laser beam in a locally limited area such that the laser-exposed area reaches a temperature of 600° C. Subsequently, an oxygen partial pressure of for example, $10^2$ Torr is generated. Then a pin layer sequence as viewed from the surface is formed only within the laser exposed area.

For generating pin structures as viewed from the surface, generally temperatures of 500–1000° C. and oxygen partial pressures of 1–1000 Torr are generated. Preferably, the perovskite is subsequently cooled down slowly to avoid mechanical tensions.

To generate nip structures as viewed from the surface, essentially the same temperatures are selected as before and oxygen partial pressures in the range of $10^{-3}$ to $1^{-12}$ Torr are provided. After the treatment, the cooling procedure is slower than 100° C./min to prevent aggregate formations.

EXAMPLES $SrTiO_3$ or $BaTiO_3$ with an admixture of Fe or W (20 ppm) are oriented in the (100)—direction, are polished and then washed. They are then heated for an hour to 850–900° C. under an oxygen partial pressure of $10^2$ Torr. Then they are slowly cooled down. (For example, at less than 10° C./min) in order to avoid mechanical tensions. At the surface, a pin layer sequence as viewed from the surface is formed. The total thickness is then about 100 nm.

In a second embodiment, the perovskites are prepared the same way and are heated to 500°. Locally, the surface is heated by laser irradiation to 600° C. Then an oxygen partial pressure is generated as in the previous example for one hour followed by a slow cool-down. The pin layer sequence is then formed only in the laser-heated areas.

In the same way, pin layer sequences—as viewed from the surface—are generated on the surfaces of $KNbO_3$—or $PbTiO_3$ perovskites. However, the temperatures during treatment are below 750° C. High temperatures would have a detrimental effect on the vapor deposition of $K_2O$ or, respectively, PbO aggregates.

For the manufacture of 100 nm thick nip layer sequences (viewed from the surface) as previously, the perovskites are heated to the same temperatures. An oxygen partial pressure of $10^{-3}$ Torr is selected. The treatment period is 2 hours. Then rapid cooling takes place (for example, faster than 100° C./min) in order to avoid disadvantageous oxidation effects.

Below the method with the detailed features as defined in the dependent claims will be described:

As a perovskite, a crystal or a ceramic member can be used. In accordance with the present process first a constant DC current flow through the perovskite is established. This is accomplished, for example, by applying electrodes to opposite sides of the perovskite and applying thereto a variable voltage.

The DC current through the perovskite must be sufficiently constant for generating the desired layer sequence.

To avoid overheating, the current density should preferably not exceed 50 $mA/cm^2$.

In an alternative procedure, the current flow can be generated by an electron beam.

The current flow through the perovskite leads to an electro-migration of the oxygen ions. This migration occurs with single crystals preferably along the 2–3 dimensional defects (so-called extended defects) in the perovskites. The oxygen ions travel from the cathode toward the anode (if the current flow is generated by way of two electrodes applied to the perovskite).

The electro-migration results in the formation of a chemical oxygen concentration gradient in the vicinity of the anode. This provides for an additional segregation of AO aggregates. Under the anode (a corresponding process occurs by electron beam exposure), a pin layer sequence is generated, that is, as viewed from the surface, there is first a p-conductive layer (enriched with AO aggregates). Below, there is an intrinsically conductive layer. Below this layer, a layer with n-conductive properties is formed. In the n-conductive layer, BO type aggregates are present in excess.

Under the cathode (the corresponding is true for electron beam exposure), a snip structure is formed. As viewed from the surface, there is first a semi-metallic layer. Below, there is a layer with n-conductive properties. Below, the n-conductive layer, there is the intrinsically conductive layer. Underneath this layer, there is a layer with p-conductive properties.

In the last mentioned layer sequence, the uppermost layer is a semi-metallic layer because the AO depleted n-conductive layer is reduced at its surface. This reduction leads to the formation of the layer with semi-metallic properties.

The snip structure below the cathode is formed particularly in the vicinity of extended defects. Because of the good electric conductivity (because of the s-layer) in the area of the extended defects on the surface of the perovskites, the effective surface is enlarged as electrode contact. This enlarged effective surface can be considered to be a virtual electrode.

If for example, at temperatures of 300 to 400° C., a current of several $mA/m^2$ is conducted through the perovskite for several hours, on one side, a pin layer and, on another side, a snip layer of a thickness of several nm are formed.

If the electrodes are removed or etched away or respectively, the electron beam exposure is discontinued the semi-metallic layer changes by partial oxidation starting at the surface.

The greater the ionic conductivity in the perovskite is the faster the desired layer sequences are formed. Preferably, the temperature of the perovskite during the passage of current is so selected that the transfer number (which represents a measure for the ionic conductivity) is high. Numbers above 0.2 are considered to be high transfer numbers.

If a perovskite in the form of a thin layer of several 100 nm is treated in accordance with the process of the invention, its capacity is clearly increased by the formation of the pin and, respectively, snip layers as compared to untreated perovskites.

Furthermore, thin layers, which have been treated with the process according to the invention, exhibit subsequently a positive temperature coefficient. A positive temperature coefficient is understood to be the following: There is a temperature range within which the perovskite exhibits an increasing resistance with increasing temperature.

Electrodes were formed, for example, on the (100) surface of a commercially available $SrTiO_3$ crystal with a thickness of 1 mm by vapor deposition. The crystal with the electrodes deposited thereon was heated to 330° C. A constant current flow of about 50 $mA/cm^2$ through the crystal was then maintained for 2 hours. Subsequently, the crystal was cooled down to room temperature and the electrodes were etched off.

In this way, the earlier mentioned layer sequences were produced.

The process was used successfully, among others, for $BaTiO_3$-ceramics, $SrTiO_3$-ceramics doped with 0.3% Fe, $AgNbO_3$-ceramics, $KNbO_3$-ceramics, $NaNbO_3$ ceramics, $PbZrO_3$-ceramics as well as single crystals of this type.

The treatment temperatures were between 300 and 500° C. The current density was less than 50 $mA/cm^2$. The treatment duration varied. It depended, particularly with ceramics, on the density and grain size of the material.

Excessive treatment periods resulted in a short circuit, that is, a continuous layer s was formed.

With the method according to the invention, perovskites with a layer sequence at the surface can be formed which includes first an AO enriched ($ABO_3$) layer and a B-oxide rich layer with an $ABO_3$ layer disposed therebetween. The AO enriched layer is p-conductive. The BO-rich layer is n-conductive. The intermediate $ABO_3$ layer has intrinsic conductivity.

Below, an electronic building component which comprises a perovskite of the type $ABO_3$ with one of the layer sequences mentioned earlier is described as an example on the basis of the accompanying drawings.

DESCRIPTION OF THE EMBODIMENTS

Figure 1:
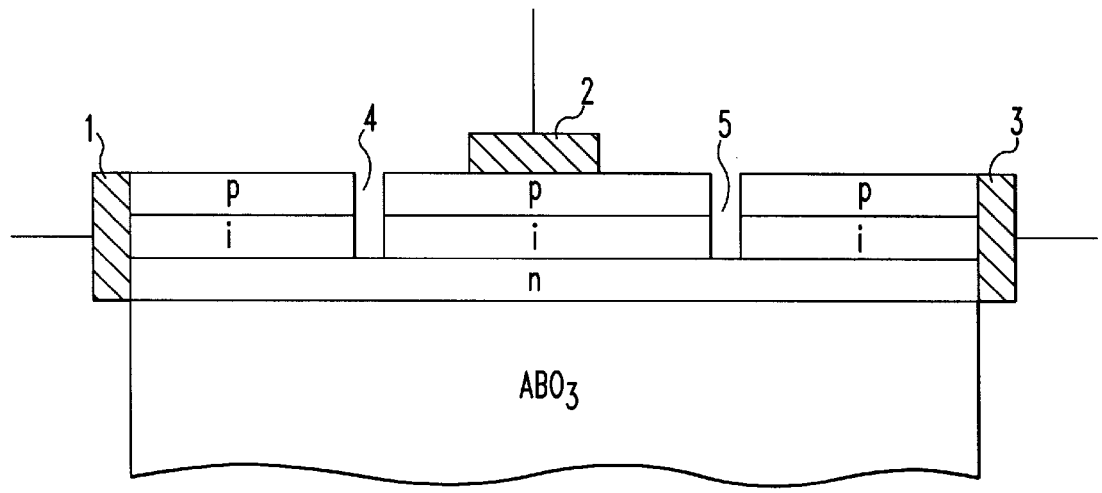
FIG. 1 is a cross-sectional view of an electronic building component.

FIG. 1 shows, in a cross-sectional view, an electronic building component including a perovskite of the type $ABO_3$ with an AO-enriched surface layer, a B-oxide-rich layer and an $ABO_3$ layer disposed therebetween.

In the surface area of the perovskite of the type $ABO_3$, a pin layer sequence was produced. The perovskite was subsequently so prepared that electrodes 1 and 3 were formed in the way as shown in FIG. 1 so that they were in contact with the pin layers at opposite ends. By an etching process, two grooves 4 and 5 were formed which extend down to the n layer. These grooves 4 and 5 interrupt the p and the i layers. To the p layer disposed between the grooves 4 and 5, an electrode 2 was applied.

Figure 2:
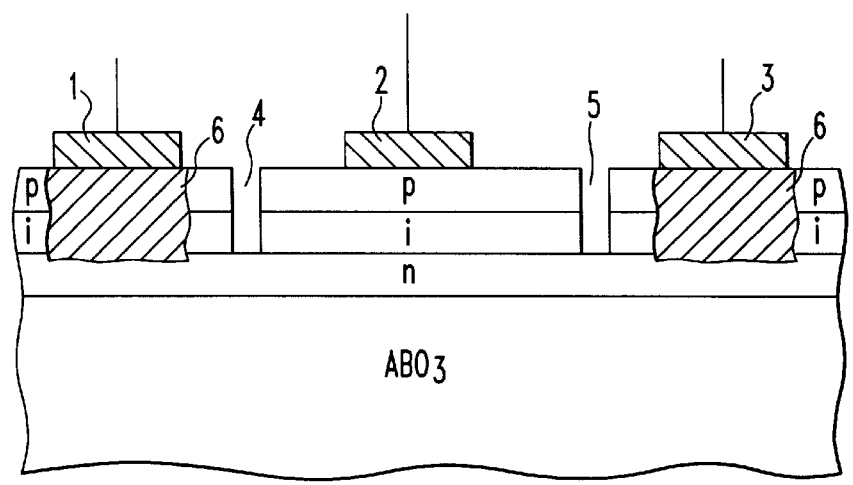
FIG. 2 is a cross-sectional view of another embodiment.

The electrodes 3 and 4 may alternatively be arranged on top of the device as shown in FIG. 2 if the p and i layers under the electrodes 1 and 3 are connected to n-conductive or semi-metallic areas 6 before the electrodes are applied. Such a conversion can be achieved by electron bombardment.

The electronic component shown in the figures is used as a transistor.

What is claimed is:

1. A process for producing, in a perovskite of the type $ABO_3$ having AO layers, a pin layer sequence by converting AO layers such that a p-conductive $AOx(ABO_3)m$ layer, an n-conductive B-oxide rich layer and, disposed therebetween, an $ABO_3$ layer with intrinsic conductivity are formed.

2. A process according to claim 1, wherein the perovskite of the type $ABO_3$ is subjected to one of oxidizing and reducing conditions.

3. A process according to claim 1, wherein said perovskite is subjected, at a temperature of higher than 500° C., to an oxygen partial pressure above the minimum of the respective temperature isotherm in a defect chemical diagram.

4. A process for producing a pin layer sequence on the surface of a perovskite of the type $ABO_3$ by conducting a constant DC current through the perovskite for generating the layer sequence to be produced.

5. A process according to claim 4, wherein the current density of the DC current is less than 50 $mA/cm^2$.

6. A process according to claim 5, wherein said perovskite is subjected to said DC current flow for at least one hour.

7. A process according to claim 4, wherein said perovskite is subjected to said DC current flow at a temperature which provides for a transfer number greater than 0.2 with respect to ionic conductivity within the perovskite.

8. A perovskite of the type $ABO_3$ having at its surface a layer sequence including an AO enriched ($ABO_3$) layer, a B-oxide rich layer and an $ABO_3$ layer disposed between the first two layers.

9. A perovskite according to claim 8, wherein said AO enriched ($ABO_3$) layer is present in the form of a $AOx$ $(ABO_3)m$ layer.

10. A perovskite according to claim 8 wherein the surface of the perovskite has an orientation (1,0,0).

11. An electronic building element which comprises a perovskite of the type $ABO_3$ having at its surface a layer sequence including an AO enriched ($ABO_3$) layer, a B-oxide rich layer and an $ABO_3$ layer disposed between the first two layers.

* * * * *